(12) United States Patent
Lee et al.

(10) Patent No.: US 8,796,608 B2
(45) Date of Patent: Aug. 5, 2014

(54) DUAL STAGE ACTIVE PIXEL DEVICES AND RELATED METHODS

(71) Applicant: Arizona Board of Regents, a body corporate of the State of AZ, Acting for and on behalf of ASU, Scottsdale, AZ (US)

(72) Inventors: Edward H. Lee, Chandler, AZ (US); David R. Allee, Phoenix, AZ (US); George R. Kunnen, Chandler, AZ (US)

(73) Assignee: Arizona Board of Regents, a body corporate of the State of Arizona, Acting for and on Behlf of Arizona State University, Scottsdale, AZ (US)

( * ) Notice: Subject to any disclaimer, the term of this patent is extended or adjusted under 35 U.S.C. 154(b) by 0 days.

(21) Appl. No.: 13/734,117

(22) Filed: Jan. 4, 2013

(65) Prior Publication Data

US 2013/0120070 A1    May 16, 2013

Related U.S. Application Data

(63) Continuation of application No. PCT/US2011/043079, filed on Jul. 6, 2011.

(60) Provisional application No. 61/504,667, filed on Jul. 5, 2011, provisional application No. 61/433,624, filed on Jan. 18, 2011, provisional application No. 61/361,663, filed on Jul. 6, 2010.

(51) Int. Cl.
*H01L 27/00* (2006.01)
*H04N 5/3745* (2011.01)

(52) U.S. Cl.
USPC ........................................ 250/208.1; 348/301

(58) Field of Classification Search
USPC ...................................................... 250/208.1
See application file for complete search history.

(56) References Cited

U.S. PATENT DOCUMENTS

| | | | |
|---|---|---|---|
| 5,917,547 A | 6/1999 | Merrill et al. | |
| 2006/0033007 A1* | 2/2006 | Terzioglu | 250/208.1 |
| 2009/0322920 A1 | 12/2009 | Terzioglu | |

OTHER PUBLICATIONS

Karim S. Karim; Arokia Nathan, Amorphous Silicon Active Pixel Sensor Readout Circuit for Digital Imaging; IEEE Transactions on Electron Devices, vol. 50, No. 1 Jan. 1, 2003.
E. Lehmann, P. Vontobel, The use of amorphous Silicon flat panels as detector in neutron imaging; Elsevier, Elsevier Ltd., Applied Radiation and Isotopes 61 (2004) 567-571 Mar. 1, 2004.
Gregory B. Raupp et al., Low-temperature amorphous-silicon backplane technology development for flexible displays in a manufacturing pilot-line environment; Journal of the SID, 15/7, Jan. 1, 2007.
R.A. Street et al., Two-dimensional amorphous silicon image sensor arrays; Elsevier Science B.V., Journal of Non-Crystalline Solids 198-200 (1996) 1151-1154 Jan. 1, 1996.
C. E. Moss et al., Detection of Uranium-Based Nuclear Weapons Using Neutron-Induced Fission; IEEE, 0-7803-0513-2/92 Feb. 1, 1992.
A. Mireshghi et al., Amorphous Silicon Position Sensitive Neutron Detector; IEEE, 0-7803-0513-2/92 Feb. 1, 1992.

(Continued)

*Primary Examiner* — Thanh Luu
*Assistant Examiner* — Renee Naphas
(74) *Attorney, Agent, or Firm* — Bryan Cave LLP

(57) ABSTRACT

Embodiments of dual stage active pixel devices are described herein. Other examples, implementations, and related methods are also disclosed herein.

25 Claims, 10 Drawing Sheets

(56) References Cited

OTHER PUBLICATIONS

Hui Tian et al., Analysis of Temporal Noise in CMOS Photodiode Active Pixel Sensor; IEEE Journal of Solid-State Circuits, vol. 36, No. 1, Jan. 1, 2001.

Sunetra K. Mendis et al., CMOS Active Pixel Image Sensors for Highly Integrated Imaging Systems; IEEE Journal of Solid-State Circuits, vol. 32, No. 2, Feb. 1, 1997.

D. Rigaud et al., Low frequency noise in thin film transistors; IEE Proceedings, Circuits Devices Syst., vol. 149, No. 1, Feb. 1, 2002.

Andrew J. Blanksby et al., Noise Performance of a Color CMOS Photogate Image Sensor; 0-7803-4100-7/97; IEEE Jul. 1, 1997.

Yavuz Degerli et al., Analysis and Reduction of Signal Readout Circuitry Temporal Noise in CMOS Image Sensors for Low-Light Levels; IEEE Transactions on Electron Devices, vol. 47, No. 5, May 1, 2000.

C.-W. Hsu, T.-H. Kuo, 6-bit 500 MHz flash A/D converter with new design techniques; IEE Proceedings, Circuits Devices Syst., vol. 150, No. 5, Oct. 1, 2003.

Rahul Shringarpure et al., Circuit Simulation of Threshold-Voltage Degradation in a-Si:H TFTs Fabricated at 175C; IEEE Transactions on Electron Devices, vol. 54, No. 7, Jul. 1, 2007.

J. M. Boudry, L. E. Antonuk, Current-noise-power spectra of amorphous silicon thin-film transistors; J. Appl. Phys. 76 (4), Aug. 15, 1994.

J. Rhayem et al., 1/f noise investigations in small channel length amorphous silicon thin film transistors; American Institute of Physics, J. Appl. Phys. 83, 3660 (1998); doi: 10.1063/1.366586 (http://dx.doi.org/10.1063/1.366586) Jan. 1, 1998.

J. Rhayem et al., 1/f noise investigations in long channel amorphous silicon thin film transistors; American Institute of Physics, J. Appl. Phys. 87 (4), Feb. 15, 2000.

Marvin S. Keshner, 1/f Noise; Proceedings of the IEEE, 0018-9219/82/0300-0212 Mar. 1, 1982.

Rahul Shringarpure et al., Compact modeling of amorphous-silicon thin-film transistors with BSIM3; Society for Information Display, Journal of the SID 16/11, Jan. 1, 2008.

David R. Allee et al., Circuit-Level Impact of a-Si:H Thin-Film-Transistor Degradation Effects; IEEE Transactions on Electron Devices, vol. 56, No. 6, (http://ieeexplore.ieee.org) Jun. 1, 2009.

Edward H. Lee et al., Effects of Gamma Irradiation and Electrical Strees on a-Si:H Thin-Film Transistors for Flexible Electronics and Displays; IEEE Journal of Display Technology, vol. 7, No. 6, (http://ieeexplore.ieee.org) Jun. 1, 2011.

R.B. Apte et al., Large-Area, Low-Noise Amorphous Silicon Imaging System; SPIE, vol. 3301 (http://www.spiedl.org) Apr. 3, 2013.

Harry McHugh et al., Laminated Amorphous Silicon Neutron Detector; DOE/NV/25946-649 Jan. 1, 2013.

International Search Report and Written Opinion for PCT Application No. PCT/US2011/043079, 9 pages. Feb. 9, 2012.

\* cited by examiner

DUAL STAGE ACTIVE PIXEL DEVICES AND RELATED METHODS

CROSS REFERENCE TO RELATED APPLICATION(S)

This patent application is a continuation of International Patent Application No. PCT/US2011/043079, filed on Jul. 6, 2011, which claims priority to U.S. provisional patent application No. 61/504,667, filed on Jul. 5, 2011, to U.S. provisional patent application No. 61/433,624, filed on Jan. 18, 2011, and to U.S. provisional patent application No. 61/361,663, filed on Jul. 6, 2010. The disclosures of the referenced applications are incorporated herein by reference.

STATEMENT REGARDING FEDERALLY SPONSORED RESEARCH OR DEVELOPMENT

This invention was made with government support under W911NF-04-2-0005 awarded by the Army Research Office The government has certain rights in the invention.

TECHNICAL FIELD

This invention relates generally to semiconductor devices and methods of providing semiconductor devices, and relates, more particularly, to dual stage active pixel devices and related methods.

BACKGROUND

Active pixel sensors (APS) have become increasingly important for several applications, including large-area flat panel sensing arrays for imaging applications. Charge-to-voltage gain is important to increase the dynamic range and resolution of APS imagers. However, signal amplification is performed before the signal is carried to external amplifiers and analog to digital (A/D) converters, where the signal is then subject to noise from parasitic impedance.

FIG. 1 presents a schematic of prior art single stage APS circuit 1000, comprising output amplifier stage 1200 to amplify signal 1290 sent, via transistors 1210 and 1220, to external amplifier 1900. Signal 1290 is affected when a photoimpact at photosensor 1280 induces a current within photosensor 1280, thereby affecting the gate voltage of transistor 1210, which in turn affects signal 1290. Thus, APS circuit 1000 can be used to detect when such photoimpact has occurred at photosensor 1820. In some examples, photosensor 1280 can be configured to react to certain kinds of photoimpacts, whether it be from photons, X-rays, neutrons, and/or other particles and/or waves. As a result, APSs circuits can be used in different applications and fields, such as in medical fluoroscopy and for countermeasures to detect radiological weapons.

Current designs using metal-oxide-semiconductor (MOS) transistors, however, suffer from the effects of noise, which, among other drawbacks, limits the dynamic operation range of the APS. Therefore, a need exists in the art to develop APS devices and related methods that address such limitations described above to provide circuits with lower input-referred noise, higher gain, greater bandwidth, and faster sampling refresh rates than conventional APSs.

BRIEF DESCRIPTION OF THE DRAWINGS

To facilitate further description of the embodiments, the following drawings are provided in which.

Figure 1:
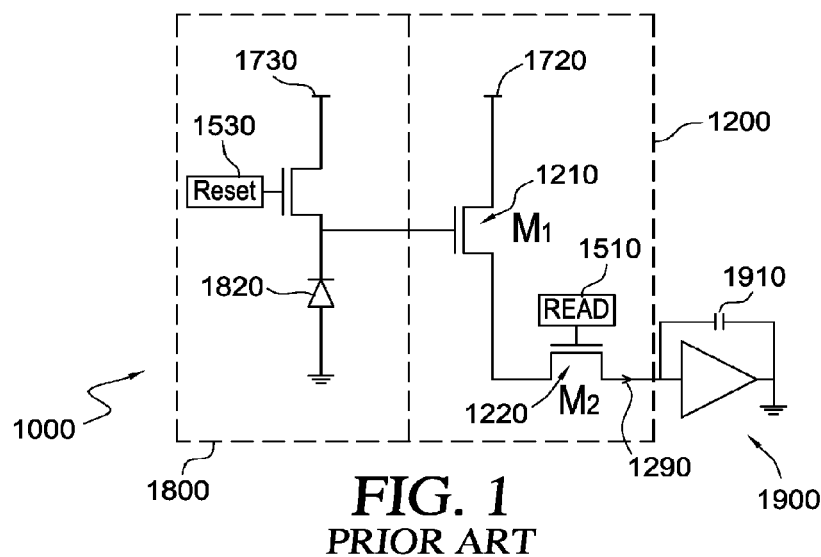
FIG. 1 presents a schematic of a prior art single stage APS circuit.

For simplicity and clarity of illustration, the drawing figures herein illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically or otherwise. Two or more electrical elements may be electrically coupled, but not mechanically or otherwise coupled; two or more mechanical elements may be mechanically coupled, but not electrically or otherwise coupled; two or more electrical elements may be mechanically coupled, but not electrically or otherwise coupled. Coupling (whether mechanical, electrical, or otherwise) may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types. The absence of the word "removably," "removable," and the like near the word "coupled," and the like does not mean that the coupling, etc. in question is or is not removable.

DESCRIPTION

In one embodiment, a device comprises a first pixel comprising a photosensor sensitive to a photoimpact, an output amplifier stage configured to output a sensor signal of the first pixel, and an intermediate amplifier stage coupled between the photosensor and the output amplifier stage.

In one example, a method in accordance with the present disclosure can comprise providing a first active pixel of an array of one or more active pixels, wherein providing the first active pixel can comprise (a) providing a photosensor sensitive to a photoimpact, (b) providing an intermediate amplifier stage coupled to the photosensor and configured to restrict an input reference noise of the first active pixel, and (c) providing an output amplifier stage coupled to the intermediate amplifier stage. The output amplifier stage can be configured to output a first current magnitude when the photosensor is exposed to the photoimpact, and to output a second current magnitude when the photosensor is unexposed to the photoimpact.

In one embodiment, a device in accordance with the present disclosure can comprise a plurality of active pixels coupled to an external amplifier to detect and register a photoimpact. The plurality of active pixels can comprise a first pixel comprising (a) a photosensor configured to detect the photoimpact when the photoimpact is incident on the photosensor, (b) an output amplifier stage configured to output a sensor signal indicative of the photoimpact at the first pixel, (c) an intermediate amplifier stage coupled between the photosensor and the output amplifier stage, and/or (d) a reset transistor coupled to the photosensor. The output amplifier stage can comprise first and second transistors, and the intermediate amplifier stage can comprise third and fourth transistors. The first transistor can comprise a first terminal coupled to a first voltage node, a second terminal coupled to the second transistor, and a control terminal coupled to the intermediate amplifier stage. The second transistor can comprise a first terminal coupled to the second terminal of the first transistor, a second terminal coupled to the external amplifier, and a control terminal coupled to a read signal node to receive a read signal. The third transistor can comprise a first terminal coupled to a second voltage node, a second terminal coupled to the control terminal of the first transistor, and a control terminal coupled to the read signal node to receive the read signal. The fourth transistor can comprise a first terminal coupled to the second terminal of the third transistor and to the control terminal of the first transistor, a second terminal coupled to a ground, and a control terminal coupled to the photosensor and to the reset transistor. The reset transistor can comprise a first terminal coupled to a third voltage node, a second terminal coupled to the photosensor and to the fourth transistor, and a control terminal coupled to a reset signal node. The photosensor can comprise a cathode terminal coupled to the control terminal of the fourth transistor and to the second terminal of the reset transistor, and an anode terminal coupled to the ground.

Other examples and embodiments are further disclosed herein. Such examples and embodiments may be found in the figures, in the claims, and/or in the description of the present application.

Figure 2:
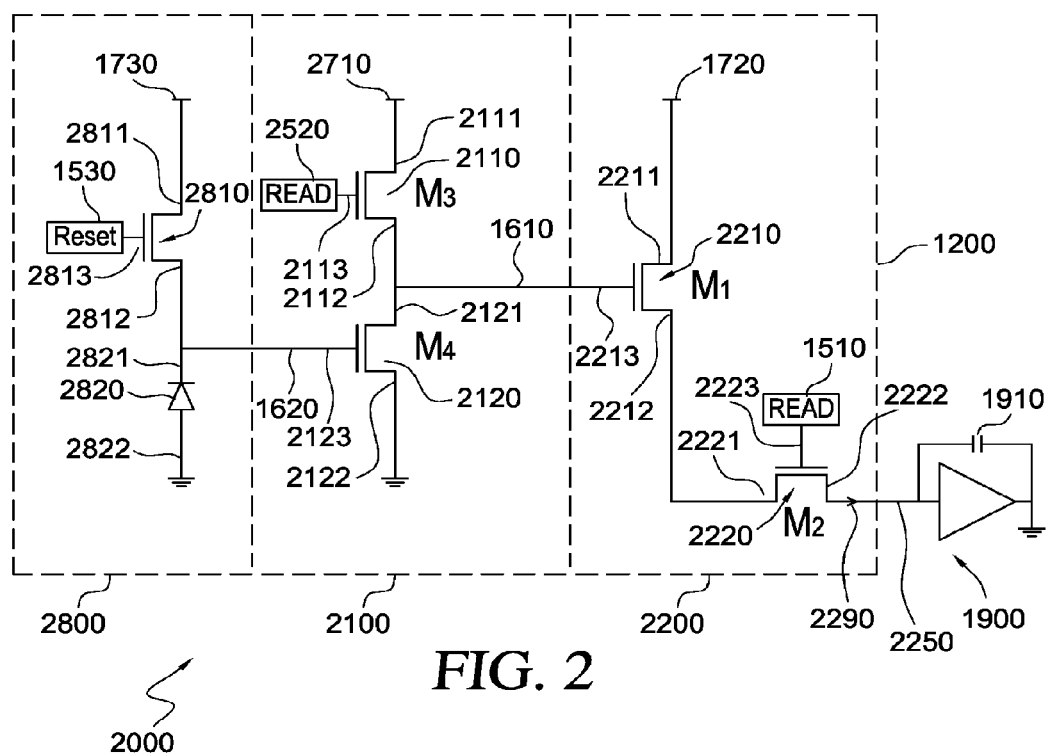
FIG. 2 presents a schematic of a dual stage APS circuit.

Turning to the drawings, FIG. 1 illustrates a schematic of prior art single stage APS circuit 1000, with a single common-drain or source-follower output amplifier stage 1200. FIG. 2 illustrates a schematic of dual stage APS circuit 2000, with output amplifier stage 2200 coupled to external amplifier 1900, and with intermediate amplifier stage 2100 coupled between output amplifier stage 2200 and input stage 2800. In the present example of FIG. 2, transistors 2110 and 2220 are coupled together to form intermediate amplifier state 2100. In some examples, output amplifier stage 1200 can be similar to output amplifier stage 2200. In the same or other examples, transistors 1210 and 1220 of output amplifier stage 1200 may have different sizes and/or width/length (W/L) dimensions than transistors 2210 and 2220 of output amplifier stage 2200. There can also be embodiments where input stage 1800 of single stage APS circuit 1000 may be similar to input stage 2800 of dual stage APS circuit 2000. In both examples of FIGS. 1-2, storage capacitor ($C_{STORE}$) 1910 represents an idealization of an external integrating amplifier. Both designs utilize a read signal from read node 1510 to sample and drive their respective APS circuit to external amplifier 1900 when switching through different columns in read mode.

In one embodiment, the dual stage APS circuit 2000 provides better performance than single stage APS circuit 1000 by having a high-voltage gain stage, in the form of intermediate amplifier stage 2100, using nMOS transistors. This feature can decrease input-referred noise by approximately half if transistor sizings are optimized, and allows sampling speeds to be much faster. As a result, the dual stage design of APS circuit 2000 is a useful alternative over the single stage design of APS circuit 1000 due to its high voltage gain and noise performance.

Continuing with the dual stage APS circuit 2000 of FIG. 2, there can be embodiments where circuit 2000 can be part of a picture element (pixel) of a device. As a result, the pixel can comprise input stage 2800 (with photosensor 2820), output amplifier stage 2200, and/or intermediate amplifier stage 2100. With circuit 2000 therein, the pixel is thus transformed in to an APS. In the same or other embodiments, the device may comprise an array of pixels and/or APSes, including pixels and/or APSes arranged in rows and columns. In some examples, output amplifier stage 2200 comprises a voltage-to-charge converter. In the same or other examples, intermediate amplifier stage 2100 can comprise a voltage-to-voltage amplifier.

In some examples, photosensor 2820 can be configured to be sensitive to one or more photoimpacts, where the photoimpacts can comprise situations where waves and/or particles, such as X-rays, neutrons, and/or photons, among others, impacts photosensor 2820 to induce a transient current therethrough. In the same or other examples, output amplifier stage 2200 can be configured to output sensor signal 2290, where sensor signal 2290 can be referenced to detect whether a photoimpact occurred upon photosensor 2820. In the same or other examples, intermediate amplifier stage 2100 is coupled between photosensor 2820 and output amplifier stage 2200, and can amplify a voltage at intermediate node 1610, to thereby control output amplifier stage 2200, based on whether the voltage at input node 1620 was affected by a photoimpact on photosensor 2820. With intermediate amplifier stage 2100 in place, an input-referred noise of circuit 2000 can be reduced compared to a circuit such as single stage APS circuit 1000 (FIG. 1), where input stage 1800 instead couples directly to output stage 1200 without intermediate amplifier 2100. In the same or other examples, the input-referred noise for dual-stage APS circuit 2000 can be reduced by approximately 40% to approximately 60% by intermediate amplifier stage 2100.

In the present example, intermediate amplifier stage 2100 comprises intermediate transistors 2110 and 2120. Intermediate transistor 2110 comprises terminal 2111 coupled to intermediate voltage node 2710, terminal 2112 coupled to intermediate node 1610, and control terminal 2113 coupled to read signal node 2520. Intermediate transistor 2120 comprises terminal 2121 coupled to intermediate node 1610, terminal 2122 coupled to ground, and control terminal 2123 coupled to photosensor 2820 via input node 1620. In addition, photosensor 2820 comprises terminal 2821 coupled to input node 1620, and terminal 2822 coupled to ground. In the present example photosensor 2820 comprises a photodiode, where terminal 2821 comprises a cathode terminal of the photodiode, and terminal 2822 comprises an anode terminal of the photodiode. In the same or other examples, photosensor 2820 is configured to decrease a voltage of input node 1620 as a result of a transient current through photosensor 2820 induced by a photoimpact on photosensor 2820.

There can be examples where a gain of intermediate amplifier stage 2100 can be configured to be of approximately $\sqrt{2}$ to reduce and/or minimize the input-referred noise of circuit 2000. To achieve such gain, a channel width of intermediate transistor 2120 can be configured to be greater than a channel width of intermediate transistor 2110 in the same or other examples. For instance, there can be examples where transistor 2120 can comprise a channel width of approximately 100 μm (micrometers) to approximately 200 μm, and where transistor 2110 can comprise a channel width of approximately 10 μm. In the same or other examples, a channel length of transistor 2110 can be configured to be greater than a channel length of transistor 2120 to achieve such gain for intermediate amplifier stage 2100. For instance, there can be examples where transistor 2110 can comprise a channel length of approximately 20 μm to approximately 50 μm, and where transistor 2120 can comprise a channel length of approximately 10 μm. The sample ratios given above can work well for most field-effect transistors (FETs), like amorphous silicon (a-Si) thin-film transistors (TFTs), although other ratios may also work in light of the $\sqrt{2}$ gain target.

In the example of FIG. 2, circuit 2000 also comprises reset transistor 2810, with terminal 2811 coupled to reset voltage node 1730, terminal 2812 coupled to input node 1620, and control terminal 2813 coupled to reset signal node 1530. Reset transistor 2810 can be configured to reset a value of the voltage at input node 1620 when reset transistor 2810 is actuated via reset signal node 1530. The voltage at input node 1620 can be reset periodically, such as to refresh due to leakage losses, and/or to reset after a photoimpact at photosensor 2820.

Output amplifier stage 2200 is coupled to intermediate amplifier stage 2100 via intermediate node 1610, and comprises output transistors 2210 and 2220 in the present example. Output transistor 2210 comprises terminal 2211 coupled to output voltage node 1720, terminal 2212 coupled to output transistor 2220, and control terminal 2213 coupled to intermediate node 1610. Output transistor 2220 comprises terminal 2221 coupled to terminal 2212 of transistor 2210, terminal 2222 coupled to output 2250 of circuit 2000, and control terminal 2223 coupled to read signal node 1510. In the present example, read signal nodes 1510 and 2520 comprise the same node and carry the same read signal, but there can be other embodiments where read signal nodes 1510 and 2520 are distinct from each other. Furthermore, although voltage nodes 2710, 1720, and 1730 are illustrated as separate voltage nodes in FIG. 2, there can be examples where two or more of the voltage nodes can be common to each other. As an example, in one embodiment, intermediate voltage node 2710 and output voltage node 1720 can comprise the same voltage node. In addition, output 2250 can comprise an output of the pixel in which circuit 2000 is located.

As seen in the schematic of FIG. 2, transistors 2110, 2120, 2210, and 2220 all comprise NMOS transistors. In the same or other examples, transistors 2110, 2120, 2210, and 2220 all comprise amorphous silicon thin-film transistors and/or pentacene transistors. There can be other implementations that could use other types of transistors, such as PMOS transistors, configured accordingly to achieve similar results.

In the embodiment of FIG. 2, terminal 2222 of transistor 2220 is coupled via output 2250 to external amplifier 1900. External amplifier 1900 comprises capacitor 1910, and is configured as a current-to-charge amplifier and/or as an integrating amplifier. In some examples, capacitor 1910 can represent an idealized total capacitance $C_{STORE}$ of external amplifier 1900. In the present example, capacitor 1910 is incrementable via output amplifier stage 2200. In the same or other examples, capacitor 1910 is incremented more via output stage 2200 when (1) a photoimpact at photosensor 2820 causes a gate voltage of transistor 2120 at input node 1620 to decrease than when (2) no photoimpact is received or recorded by photosensor 2820. Such decrease in the gate voltage of transistor 2120 causes an increase in the gate voltage of transistor 2210, when transistors 2110 and 2220 are actuated via the read signal, thereby increasing sensor signal 2290 received by capacitor 1910. The increased capacitance of capacitor 1910 can then be read and interpreted to signify a photoimpact at photosensor 2820.

In the same or other embodiments, when no photoimpact is incident on photosensor 2820, the gate voltage of transistor 2120 remains substantially unaffected such that, when the read signal actuates transistors 2110 and 2220, the gate voltage of transistor 2210 is set to a first gate voltage level via transistor 2110 to actuate transistor 2210 and charge capacitor 1910 of external amplifier 1900 to a first charge level via transistors 2210 and 2220. In contrast, when the photoimpact is incident on photosensor 2820, the gate voltage of transistor 2120 is decreased such that, when the read signal actuates transistors 2110 and 2220, the gate voltage of transistor 2210 is set to a second gate voltage level via transistor 2110 to actuate transistor 2210 and to charge capacitor 1910 of external amplifier 1900 to a second charge level via transistors 2210 and 2220. In such embodiments, the second gate voltage level is greater than the first gate voltage level, and the second charge level is greater than the first charge level. The incidence of the photoimpact can thus be recorded by determining whether capacitor 1910 comprises either the first or second charge level.

Figure 12:
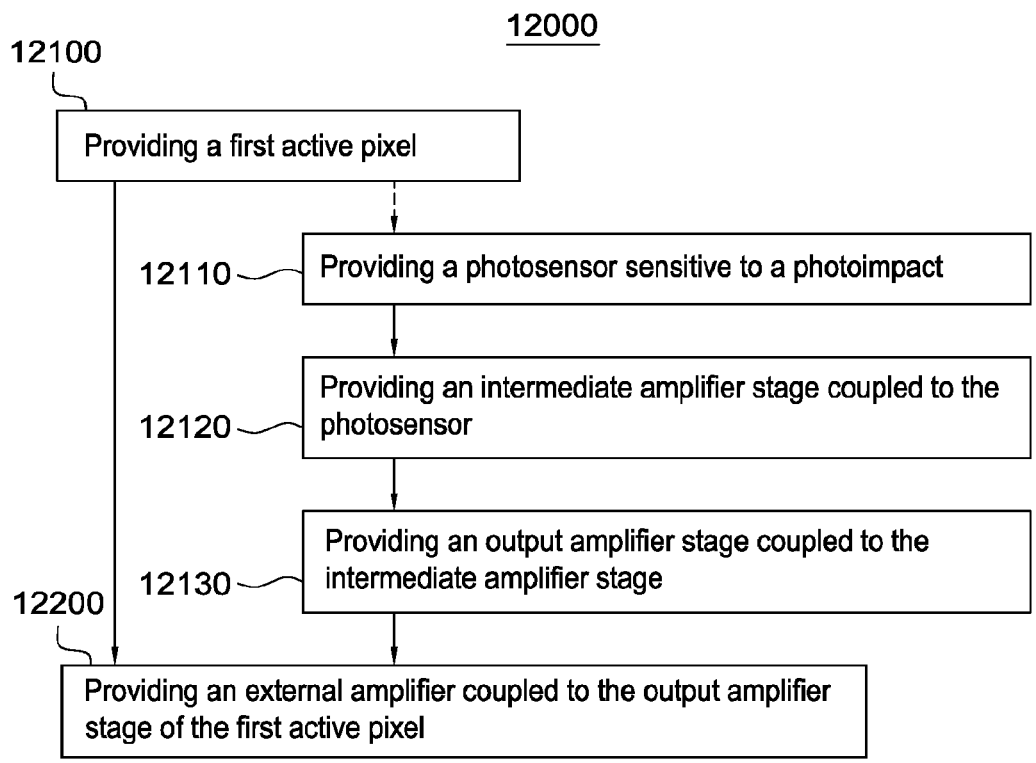
FIG. 12 illustrates a flowchart of a method for providing an active pixel sensor in accordance with the present disclosure.

Skipping ahead in the figures, FIG. 12 illustrates a flow-chart of method 12000 for providing an active pixel sensor (APS) in accordance with the present disclosure. In some examples, the APS of method 12000 can be similar to dual stage APS circuit 2000 (FIG. 2).

Block 12100 of method 12000 comprises providing a first active pixel. There can be examples where the first active pixel of block 12100 comprises an APS similar to dual stage APS circuit 2000 (FIG. 2). In the same or other examples, the first active pixel can be provided as part of an array of one or more active pixels. In such examples, several or all of the one or more active pixels of the array may comprise respective APSs. The first active pixel, and/or the array of one or more active pixels, can be configured to detect one or more photoimpacts.

Block 12100 can be subdivided into several sub-blocks. For example, sub-block 12110 of block 12100 comprises providing a photosensor sensitive to a photoimpact. In some examples, the photosensor can be similar to photosensor 2820 (FIG. 2), and/or coupled to the rest of the APS in a manner similar to that described for photosensor 2820.

Block 12100 can also comprise sub-block 12120 for providing an intermediate amplifier stage coupled to the photosensor of sub-block 12110. In some examples, the intermediate amplifier stage of sub-block 12120 can be similar to intermediate amplifier stage 2100 of dual stage APS circuit 2000 (FIG. 2), and/or coupled to the rest of the APS in a manner similar to that described for intermediate amplifier stage 2100. For example, the intermediate amplifier stage of sub-block 12120 can comprise transistors similar to intermediate transistors 2110 and/or 2120 (FIG. 2).

Block 12100 can also comprise sub-block 12130 for providing an output amplifier stage coupled to the intermediate amplifier stage of sub-block 12120. In some examples, the output amplifier stage of sub-block 12130 can be similar to output amplifier stage 2200 of dual stage APS circuit 2000 (FIG. 2), and/or coupled to the rest of the APS in a manner similar to that described for output amplifier stage 2200. For example, the output amplifier stage of sub-block 12130 can comprise transistors similar to output transistors 2210 and/or 2220 (FIG. 2).

In some examples, method 12000 can also comprise block 12200 for providing an external amplifier coupled to the output amplifier stage of the first active pixel. There can be examples where the external amplifier can be similar to external amplifier 1900 (FIGS. 1-2). In the same or other examples, the external amplifier can comprise a capacitor similar to capacitor 1910 1900 (FIGS. 1-2) that can be charged to different levels by the first active pixel, depending on whether a photoimpact was incident on the first active pixel. In some examples, the external amplifier may be shared by several of the one or more active pixels of the array.

In some examples, one or more of the different procedures of method 12000 can be combined into a single block or performed simultaneously, and/or the sequence of such blocks can be changed. For example, block 12200 could be performed before, or simultaneously with, block 12100 in some examples. In the same or other examples, the sequence of sub-blocks 12110, 12120, and 12130 can be changed, and/or sub-blocks 12110, 12120, and/or 12120 can be performed simultaneously.

There can also be examples where method 12000 can comprise further or different procedures. As an example, method 12000 could comprise another block for providing a reset transistor similar to transistor 2810 (FIG. 2). Other blocks for operating the APS could also be added, such as a block for resetting the APS via the reset transistor, a block for pre-sampling the capacitance of the external amplifier, an idling block for permitting any photoimpact during a sampling period, and/or a block for post-sampling the capacitance of the external amplifier to determine whether it changed as a result of a photoimpact. Other variations can be implemented for method 12000 without departing from the scope of the present disclosure.

Comparison of Single and Dual Stage Designs

A comparison of both the single stage design of FIG. 1 and the dual stage design of FIG. 2 follows. Throughout the comparison, several elements may be referred to using more generic labels. For example, when referring to the single stage design of FIG. 1, element M1 can refer to a transistor similar to transistor 1210, and element M2 can be used to refer to a transistor similar to transistor 1220. Similarly, when referring to the dual stage design of FIG. 2; element M1 may refer to a transistor similar to transistor 2210; element M2 may refer to a transistor similar to transistor 2220; element M3 may refer to a transistor similar to transistor 2110; and element M4 may refer to a transistor similar to transistor 2120.

I. Operation

Both designs convert a small-signal voltage change at the input into a change in current at the output. The outputs are attached to an external integrator to form a complete charge-to-voltage amplifier—one amplifier per column in order for each selected row to be read out simultaneously.

The operation of the Single-Stage design can be describes as follows: First, the RESET switch is turned on, while READ is off, to reverse-bias and charge up the photodiode to a fixed voltage. RESET is then turned off setting the photodiode acting as a capacitor, $C_{PIX}$, to be floating. RESET and READ are then turned off. During this period, photons incident on the diode generate collected electron-hole pairs inducing a current pulse $i_{SIG}$, and pulling the floating potential of $C_{PIX}$ down by $\Delta V_{PIX}$ and charge by $\Delta Q_{PIX}$. Finally, in Readout mode, READ is pulsed on to allow the output current to charge up the external amplifier for a period of $T_s$.

The Dual-Stage design also follows these three modes, with READ shared in both the first and second stages. But instead of directly converting from input voltage to current like the single-stage design, the dual-stage design begins with a voltage-to-voltage amplification to amplify the total current and voltage gain. One important difference is that the reverse bias potential will be smaller for the photodiode in the dual-stage circuit than in the single-stage. While this won't dramatically affect the readout or noise performance, a lower reverse bias will increase the diode depletion region's capacitance per unit area which will decrease the total charge-to-voltage gain. A solution to a lowered reverse bias is to use smaller diodes. In any event, the lowered thermal (kTC) reset noise outweighs this disadvantage.

Figure 3:
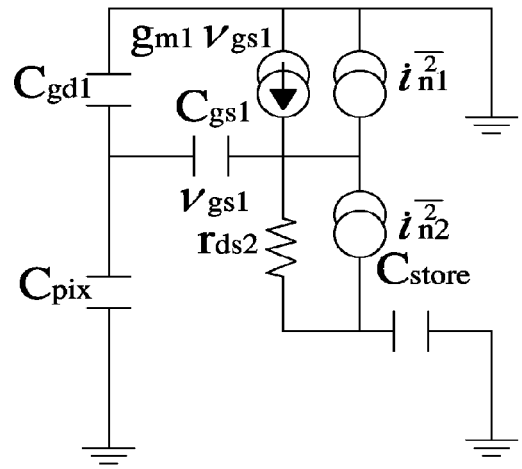
FIG. 3 illustrates a prior art small-signal model for the circuit of FIG. 1.

II. Power Spectral Density (PSD) of Noise Voltage at the Output Due to Internal Noise Sources for Single-Stage Amplifier The noise analysis on the single stage readout circuit as shown in FIG. 1 is done by extracting its small-signal model, where $i_n$ denotes the PSD noise current from both the thermal and flicker (1/f) noise sources within each TFT. FIG. 3 illustrates the prior art small-signal model for the prior art single stage circuit of FIG. 1.

The sampling transistor READ $M_2$ is represented by its drain-to-source resistance $r_{ds2}$. $C_{PIX}$ is the sum of capacitances across the photodiode, $C_{gs1}$ is the gate-to-source high-frequency parasitic capacitance in the AMP $M_2$, and $C_{STORE}$ is the idealized total capacitance of the external current-to-charge amplifier. In readout mode (READ TFT is on), the circuit behaves as a source-follower configuration. The biasing current through READ ($M_2$) and AMP ($M_1$) is dependent on DC biasing of the three transistors and their internal transistor parameters.

Applying nodal analysis in the frequency domain (s=jω) of the small-signal equivalent model (FIG. 3) leads to the 1st-order relation for the output noise level at the node of $C_{STORE}$ (Equation 1).

$$v_{n,out} = \frac{R_{eq1}i_{n1} + r_{ds2}i_{n2}}{1 + j\left(\frac{\omega}{\omega_{eqA}}\right)} \quad \text{(Equation 1)}$$

where $$R_{eq} = \left[\frac{1}{g_{m1}}\frac{C_{PIX} + C_{gs1}}{C_{PIX}}\right],$$

$$\omega_{eq} = \left[C_{STORE}\left(\frac{1}{g_{ds2}} + \frac{1}{g_{m1}}\right)\right]^{-1}$$

We assume that the operating frequency is much smaller than the second pole $f \ll g_{m1}/C_{gs1}$.

Equation 1 may also be written as:

$$v_{n,out} = H_1(j\omega)i_{n1} + H_2(j\omega)i_{n2}$$

where the first-order approximation low pass transfer functions for each noise current source are:

$$H_1(j\omega) = \frac{R_{eq}}{1 + j\left(\frac{\omega}{\omega_{eq}}\right)},$$

$$H_2(j\omega) = \frac{r_{ds2}}{1 + j\left(\frac{\omega}{\omega_{eq}}\right)}$$

(Single-stage approximation formulas)

Both current noise sources contribute in the linear system to the noise-equivalent voltage at the storage capacitor. The total Power Spectral Density (PSD) at the output is given by:

$$S_{v,out} = |H_1(j\omega)|^2 S_{i_{n1}} + |H_2(j\omega)|^2 S_{i_{n2}}$$

$$S_{i_n} = a_{th} + \frac{a_{fl}}{f}$$

where $S_{i_n}$ represents the PSDs of the input thermal and flicker noise sources from each of TFTs ($M_1$ and $M_2$) during READ mode. The PSD is constant in the frequency domain for white noise and 1/f for flicker noise. For TFTs under saturation, the thermal noise coefficient $a_{th}=8/3\,kTg_m$ is used while in linear regime, $a_{th}=4\,kTg_{ds}$.

The flicker noise coefficient for a-Si:H TFTs can be modeled as follows for both saturation and linear operation modes:

$$a_{fl,saturation} = \frac{\alpha_{sat}q\mu_{eff}^2 C_G(W/L)^2(V_{GS}-V_{th})^3}{2WL}$$

$$a_{fl,linear} = \frac{\alpha_{lin}q\mu_{eff}^2 C_G(W/L)^2(V_{GS}-V_{th})}{WL}V_{DS}^2$$

The experimentally determined value for $\alpha_{sat}$ and $\alpha_{lin}$ are 0.02 and 0.008 respectively. Then, the total output-referred noise variance is given as the sum of noise variances contributed by $M_1$ and $M_2$ as shown. The flicker noise variance contribution from the integral is singular at f=0 Hz and the total observation period $T_{obs}=1/f_{min}$ during readout phase is generally not very large. As assume a finite, non-zero $f_{min}=1/T_s$.

$$\overline{V_o^2(t)} = \sigma^2(\text{out})$$

$$= \int_{f_{min}}^{\infty} S_{v,out}(f)df$$

$$= \sum_{k=1}^{2} \overline{V_k^2(t)}$$

$$= \int_{f_{min}}^{\infty} |H_{Dual,3}(f)|^2\left(a_{th} + \frac{a_{fl}}{f}\right)df$$

Figure 4:
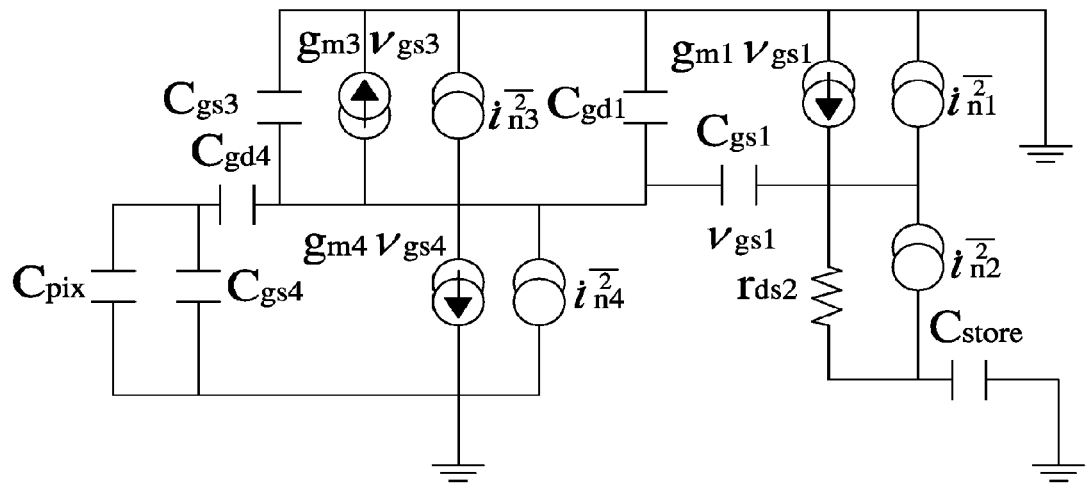
FIG. 4 illustrates a small-signal equivalent model for the circuit of FIG. 2.

III. PSD of Noise Voltage at the Output Due to Internal Noise Sources for Proposed Dual-Stage Amplifier FIG. 4 illustrates the small-signal equivalent model for the dual-stage amplifier circuit of FIG. 2. Since there are four current noise sources, we can write the noise voltage as a combination of uncorrelated random inputs in the following linear system:

$$v_{n,out} = H_1(j\omega)i_{n1} + H_2(j\omega)i_{n2} + H_3(j\omega)i_{n3} + H_4(j\omega)i_{n4}$$

For each noise source in the system above, the noise equivalent transfer function for each noise current source (i) is:

$$H_i(s) = \frac{N_i(s)}{D_i(s)}$$

where $N_1(s) = g_{ds2}g_{m3} + (C_{gs1} + C_{gs3})g_{ds2}s$ $N_2(s) = g_{m1}g_{m3} + C_{gs1}C_{gs3}s^2 + C_{gs3}g_{m1}s + C_{gs1}g_{m3}s$ $N_3(s) = g_{ds2}g_{m1} + C_{gs1}g_{ds}s$ $N_4(s) = N_3(s)$ and $D(s) =$ $(g_{ds2}g_{m1}g_{m3} + \{(C_{gs3}g_{m1} + C_{gs1}g_{m3} + C_{store}g_{m3})g_{ds2} + C_{store}g_{m1}g_{m3}\}s +$ $\{(C_{gs1}C_{gs3} + C_{gs1}C_{store} + C_{gs3}C_{store})g_{ds2} +$ $C_{gs3}C_{store}g_{m1} + C_{gs1}C_{store}g_{m3}\}s^2 + C_{gs1}C_{gs3}C_{store}s^3)$ (Dual-stage general formulas)

The total PSD is then given by $$S_{v,out}(\omega) = \sum_{k=1}^{4} |H_k(j\omega)|^2 S_{i_{n,k}}$$

where $S_{i_n}$ represents the PSD for each of the 4 noise sources ($M_1$, $M_2$, $M_3$, $M_4$) in the dual-stage circuit. When the second source-following stage of the 2-stage circuit design is made and operates identically to the 1-stage circuit (e.g. same DC biasing), the PSDs of $M_1$ and $M_2$ are equal.

$$S_{i_{n2}Dual} = S_{i_{n2},Single} \text{ and } S_{i_{n1}Dual} = S_{i_{n1},Single}$$

The RMS noise voltage for the dual-stage is expressed as the integral of the output PSD (zero mean) over all frequencies.

$$\overline{V_o^2(t)} = \sigma^2(\text{out})$$
$$= \int_{f_{min}}^{\infty} S_{v,out}(f) df$$
$$= \sum_{k=1}^{4} \overline{V_k^2(t)}$$

IV. PSD of Reset Noise Contribution

When the RESET TFT is on, the RESET's drain-to-source resistance contributes thermal noise that is low-pass filtered by the effective capacitance at the input. This is given by:

$C_{eff} = C_{pix} + (1 - A_{V_{GS4}}) C_{gs4}$.

The output-referred noise variance is then given by:

$$\sigma^2_{Single,RESET} = \frac{kT}{C_{eff}} = \frac{kT}{C_{pix}}$$

where $A_{V_{GS1}}$ is the DC voltage gain across the gate to source.

Since the drain voltage is fixed at $V_{DD}$, the source voltage of $M_1$ moves with the gate voltage. Because channel-length modulation is not observed in FDC's fabricated a-Si TFTs, $A_{V_{GS1}} = 1$ V/V.

$$A_{V_{GS1}} = \frac{1}{1 + \frac{1}{g_{m1} r_{ds1}}} \Bigg|_{r_{ds1} \to \infty} = 1 \frac{V}{V}$$

However, the RESET noise variance of the dual-stage amplifier is given as:

$$\sigma^2_{Dual,RESET} = \frac{kT}{C_{eff}} = \frac{kT}{C_{pix} + C_{gs4} + (1 - A_{V_{GD4}}) C_{gd4}}$$

In the dual-stage, the dc gain $$A_{V_{GD4}} = \frac{V_B}{V_A}$$

is:

$$A_{V_{GD4}} = \frac{-g_{m4}}{g_{m3} + \frac{1}{r_{ds4}}} \Bigg|_{r_{ds4} \to \infty} = -\frac{g_{m4}}{g_{m3}}$$

Thus, we can rewrite the dual-stage's reset noise variance as:

$$\sigma^2_{Dual,RESET} = \frac{kT}{C_{pix} + C_{gs4} + \left(1 + \frac{g_{m4}}{g_{m3}}\right) C_{gd4}}$$

Since the noise variance becomes amplified by the overall circuit, the variance at the output due to the RESET transistor becomes:

$$\begin{cases} \sigma^2_{Single,RESET}(\text{out}) = A_{V2}^2 \frac{kT}{C_{pix}} \\ \sigma^2_{Dual,RESET}(\text{out}) = (A_{V1} A_{V2})^2 \frac{kT}{C_{pix} + C_{gs4} + \left(1 + \frac{g_{m4}}{g_{m3}}\right) C_{gd4}} \end{cases}$$

V. Analysis of Noise Performance with and without RESET's Noise Contribution

The total output-referred noise voltage variance for the conventional single-stage amplifier can be computed as:

$$\sigma^2_{Single}(\text{out}) = \sum_{k=1}^{2} \int_{f_{min}}^{\infty} |H_{Single,k}(f)|^2 S_{i_{n,k}}(f) df$$

While the total output-referred noise voltage for the dual-stage amplifier is:

$$\sigma^2_{Dual}(\text{out}) = \sum_{k=1}^{4} \int_{f_{min}}^{\infty} |H_{Dual,k}(f)|^2 S_{i_{n,k}}(f) df$$

The input-referred noise is the total output-referred noise voltage divided by circuit's signal gain, $A_{V2}$, of the voltage-to-charge converter. The expression below is the input-referred noise without RESET's contribution.

$$A_{V2} = \frac{\Delta V_{out}}{\Delta V_{in}}$$
$$= \frac{\Delta I_{out} T_s / C_{store}}{\Delta V_{in}}$$
$$= \frac{(g_m \Delta V_{in}) T_s / C_{store}}{\Delta V_{in}}$$
$$= \frac{g_m T_s}{C_{store}} \sigma^2_{Single}(\text{input})$$
$$= \left(\frac{1}{A_{V2}}\right)^2 \sum_{k=1}^{2} \int_{f_{min}}^{\infty} |H_{Single,k}(f)|^2 S_{i_{n,k}}(f) df$$

where the length of time during readout to external amplifier is $T_s$ for the output current to charge the storage capacitor, and the total transconductance gain of the second stage is $g_m$.

Similarly, the input-referred noise without RESET's contribution of the Dual-stage is the total output-referred noise variance divided by the gains of both stage 1 and 2:

$$\sigma^2_{Dual}(\text{input}) = \left(\frac{1}{A_{V1} A_{V2}}\right)^2 \sum_{k=1}^{4} \int_{f_{min}}^{\infty} |H_{Dual,k}(f)|^2 S_{i_{n,k}}(f) df$$

where $A_{V1}$ is found by the DC voltage transfer characteristic of the common-source with saturated load circuit of the voltage amplifier:

$$A_{V1} = \frac{dV_{out}}{dV_{in}} = \sqrt{\frac{u_{eff,4} C_{ox,4} (W/L)_4}{u_{eff,3} C_{ox,3} (W/L)_3}} \quad \text{(Equation 2)}$$

Figure 5:
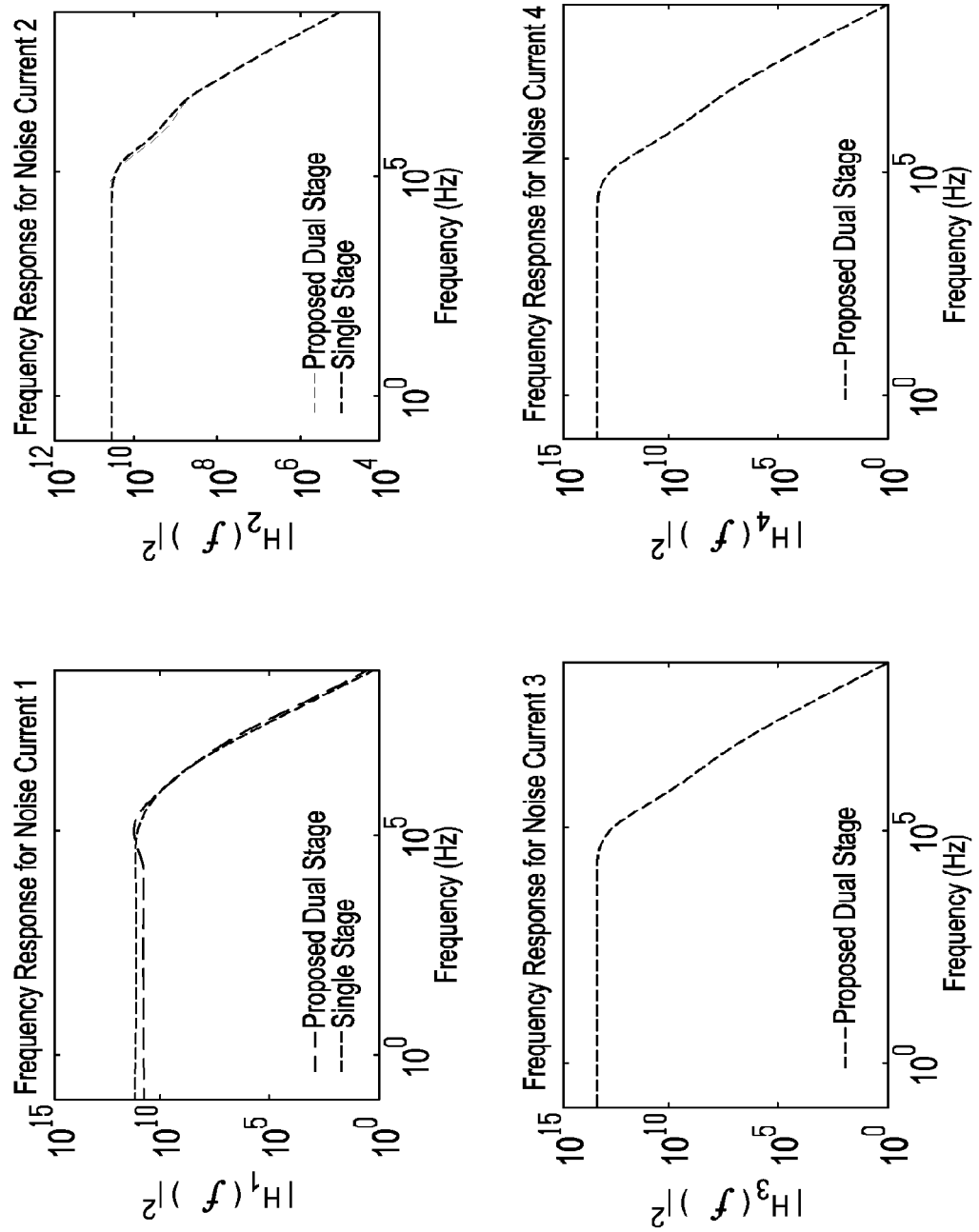
FIG. 5 presents diagrams of transimpedance frequency responses for the noise-equivalent filters of each of the noise sources of the transistors of FIGS. 1-2.

To determine the figure of merit, F, for noise, defined as the ratio of the input-referred noise of the dual-stage amplifier to that of the single-stage circuit, the biasing, and sampling parameters on the second stages for each circuit are consistent with one another. FIG. 5 presents diagrams of transimpedance frequency responses of the noise-equivalent filters for each of the noise sources of M1-M4. As can be seen in FIG. 5, the magnitude squared for noise source currents 1 and 2 are approximately equal to each other both the single stage and dual stage circuits. Accordingly, the transfer functions and the magnitude squared of the system are approximately equal to each other, as summarized by the following approximation formula:

$$\begin{cases} |H_{SingleStage,1}(f)|^2 \approx |H_{DualStage,1}(f)|^2, & f < f_{Bandwidth} \\ |H_{SingleStage,2}(f)|^2 \approx |H_{DuaStage1,2}(f)|^2, & f < f_{Bandwidth} \end{cases}$$

(Dual-stage approximation formulas)

For frequencies greater than $10^5$ Hz in the current example, however, the frequency response for $M_1$ in the dual stage circuit is slightly but non-trivially greater than the frequency response for M1 in the single stage circuit. Thus, when the device is designed to operate above the $10^5$ Hz bandwidth frequency set by the external charge amplifier during readout, the previously described dual stage general formulas should be used instead of the dual stage approximation formulas above, even though the error is less than 6%.

For the figure of merit of input referred noise, we see that:

$$F_{ReadMode} = \frac{\sigma^2_{Dual}(\text{input})}{\sigma^2_{Single}(\text{input})}$$

$$= \frac{\left(\frac{1}{A_{V1}A_{V2}}\right)^2 \sum_{k=1}^{4} \int_{f_{min}}^{\infty} |H_{Dual,k}(f)|^2 S_{i_{n,k}}(f) df}{\left(\frac{1}{A_{V2}}\right)^2 \sum_{k=1}^{2} \int_{f_{min}}^{\infty} |H_{Single,k}(f)|^2 S_{i_{n,k}}(f) df}$$

$$\approx \frac{1}{A_{V1}^2}\left(1 + \frac{\sigma^2_{Dual,3}(\text{out}) + \sigma^2_{Dual,4}(\text{out})}{\sigma^2_{Single,1}(\text{out}) + \sigma^2_{Single,2}(\text{out})}\right)$$

We thus see that the dual-stage APS will have lower input-referred non-RESET noise than the conventional when F is smaller than 1. We can rewrite this as:

$$\sqrt{1 + \frac{\sigma^2_{Dual,3}(\text{out}) + \sigma^2_{Dual,4}(\text{out})}{\sigma^2_{Single,1}(\text{out}) + \sigma^2_{Single,2}(\text{out})}} < |A_{V1}(W_{M_3}, W_{M_4})|$$

It is important to note that both the voltage gain $A_{V1}$ and the noise contributions from the first stage of the dual-stage design are functions of the sizes of $M_3$ and $M_4$.

For the figure of merit with respect to reset:

$$F_{RESET} = \frac{\sigma^2_{Dual,RESET}(\text{in})}{\sigma^2_{Single,RESET}(\text{in})} = \frac{C_{pix}}{C_{pix} + C_{gs4} + \left(1 + \frac{g_{m4}}{g_{m3}}\right)C_{gd4}}$$

We see that the RESET contribution to the input-referred noise is lower for the cascaded dual-stage than the single stage. This is due to greater shared parasitic capacitances at the input sensing node, which lowers the thermal noise bandwidth.

VI. Optimization of Stage 1's Voltage Gain

Using HSPICE to determine the DC operating points for the a-Si TFTs and MATLAB to analyze noise, we find that the flicker noise contribution is roughly in 1-2 orders of magnitude larger than the thermal noise variance for both circuits. This factor becomes incrementally greater when the observation time is increased.

However, the flicker noise contribution of the dual-stage is comparable to that of the single-stage. We see from FIG. 5 that the frequency responses of the dual-stage transfer functions in stage 1 ($M_3$ and $M_4$) are slightly greater for all frequencies of interest than the single-stage transfer functions in stage 2 ($M_1$ and $M_2$). However, the flicker noise coefficients ($a_{fl}$) for the dual-stage are in 2-3 orders of magnitude smaller than those for the single-stage due to smaller $I_{DS}$ bias currents and voltages.

$$\frac{a_{fl,dual,3} + a_{fl,dual,4}}{a_{fl,Single,1} + a_{fl,Single,2}} < 1$$

For most FETs, such as a-Si TFTs, the flicker noise power spectral density follows an inverse proportionality with the device area and frequency. We also note that a-Si TFTs generally have low intrinsic electron mobilities and therefore the bandwidth of a-Si-based circuits is also small compared to conventional CMOS technology. Therefore, the thermal noise power spectral density, which is flat over frequency range, is also band-limited. Because of this, the flicker noise spectral power dominates for low frequencies and should be the primary focus for noise analysis. Therefore, the approximate minimum area (gate widths and lengths) for transistors $M_4$ and $M_3$, in order for the dual-stage pixel's input referred noise to be lower than that of the single stage pixel, is lower-bounded by flicker noise.

From the range of feasible sizes for transistors $M_1$ and $M_2$, the minimum voltage gain in stage 1 to meet the requirement $F_{ReadMode} < 1$ is $$\min(|A_{V1}|) \approx \sqrt{2}$$

Figure 6:
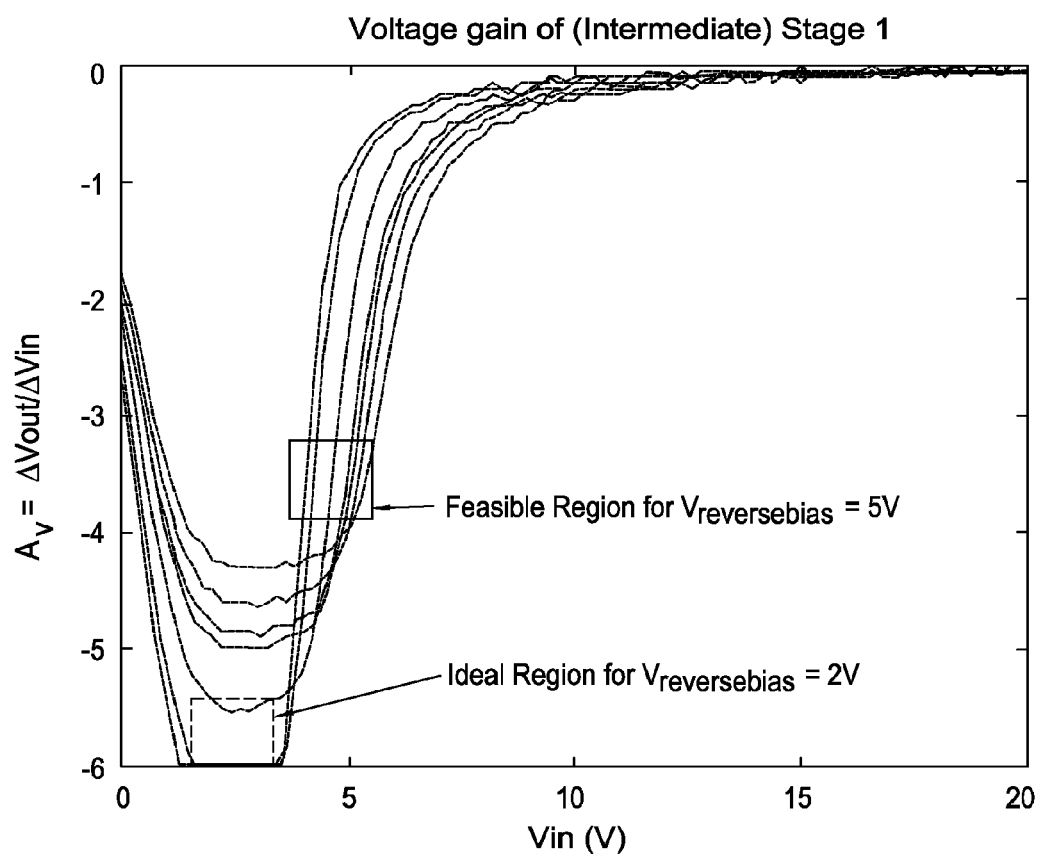
FIG. 6 presents a diagram of simulated voltage gains using various transistor sizes for the intermediate amplifier stage of the circuit of FIG. 2.

We see from Equation 2 that this design requirement can be achieved by making the width of $M_4$ large compared to that of $M_3$ and/or increasing the length of $M_3$ compared to $M_4$. The advantages (besides lower input-referred noise) of having a high-voltage gain stage before the source-following stage are 1) higher signal gain—to—sampling time ratio and 2) a potential decrease in transistor widths to achieve the same noise performance as the single-stage APS. Due to constraints on the APS photodiode, for all practical purposes the reverse bias on the photodiode or the input voltage of the first stage should be between 4.5 to 5V as shown from the HSPICE DC sweep on the first stage in FIG. 6. A reverse-bias that is any greater than around 5.5V will result in loss of gain even for compensated transistor widths. Furthermore, the output voltage that is driven to the input of the second stage decreases as the gain increases. As a result, $V_{dd(2)}$ of the first stage rises in order to compensate this shift. But practical limitations on $V_{dd}$ for a-Si:H TFTs have set this parameter to be no more than 35-40V for a-Si:H TFTs. Therefore in this study, we set $A_v$ to be near 3.67 V/V for practical purposes. However, we also conclude that $A_v$ of 5-6 V/V is possible if the reverse bias of <5 V could be met. By setting this limitation on the photodiode, the power consumed due to the first stage will decrease significantly as well.

In light of the flicker noise considerations described above, it can also be shown from the relation $\min(|A_{V1}|) \approx \sqrt{2}$, where flicker noise dominates over thermal noise valid for amorphous silicon technology, that the minimum voltage gain with the highest relative noise performance of the intermediate stage can be achieved with the following relationship between the width and lengths of $M_3$ and $M_4$:

$$(W/L)_4 \geq 2(W/L)_3.$$

In one example, for a minimum 10 μm process, the minimum length of $M_4$ and minimum width for $M_3$ can be of approximately 10 μm. Based on the relationship above, such dimensions would lead to a minimum width of approximately 100 μm for $M_4$, and a minimum length of approximately 20 μm for $M_3$.

We also note that increasing the total gate areas of transistors $M_4$ and $M_3$ will decrease the flicker noise and RESET noise contributions. However, total gate areas cannot be made too large such that the charge signal generated at the input cannot be detected due to increased capacitance.

Considering the above, for projects involving ultra-low and fine sensing applications (e.g. detecting 1-2 neutrons), one embodiment could comprise the width of TFT $M_4$ being no greater than $W_{max,M4} \approx 200$ μm, and the length of TFT $M_3$ being no greater than $L_{max,M3} \approx 50$ μm. With such maximum allowed sizes, the minimum width for TFT $M_3$ ($W_{mm,M3}$), and the minimum length for TFT $M_4$ ($L_{min,M4}$) can each be set to around 10 μm, considering the 10 μm process-limited size.

In light of the above, to achieve low input-referred noise for the dual-stage design, compared to the single-stage design, the channel length of $M_4$ and the channel width of $M_3$ can be minimized.

VII. Optimization of Stage 2's Total Noise Performance

Minimizing input-referred noise by considering all circuit parameters as free variables can be ideally done but is neither practical nor insightful to implement. Instead, we use a divide-and-conquer approach to break this optimization problem. A simple and intuitive minimization technique of Input-Referred Noise due to $2^{nd}$ Stage is performed using the following heuristic:

1: Obtain Stage-1 inputs (circuit parameters) using the designed and feasible gain of stage 1.
2: Obtain a range of feasible values for widths of $M_1$ and $M_2$ to simulate using HSPICE Monte Carlo technique.
3: Minimize F without RESET contribution or maximize the distance as a function of widths of $M_1$, $M_2$, and the operating bandwidth.

$$|A_{V1}| \sim \sqrt{1 + \frac{\sigma^2_{1st\text{-}Stage}(\text{out})}{\sigma^2_{2nd\text{-}Stage}(\text{out})}} = f(M_1, M_2, BW)$$

4: Subject to the biasing conditions (DC gate bias on $M_1$ and $M_2$) set by the $1^{st}$ stage. Determine $F_{Total}$ which includes the RESET Noise Contribution.

Figure 7:
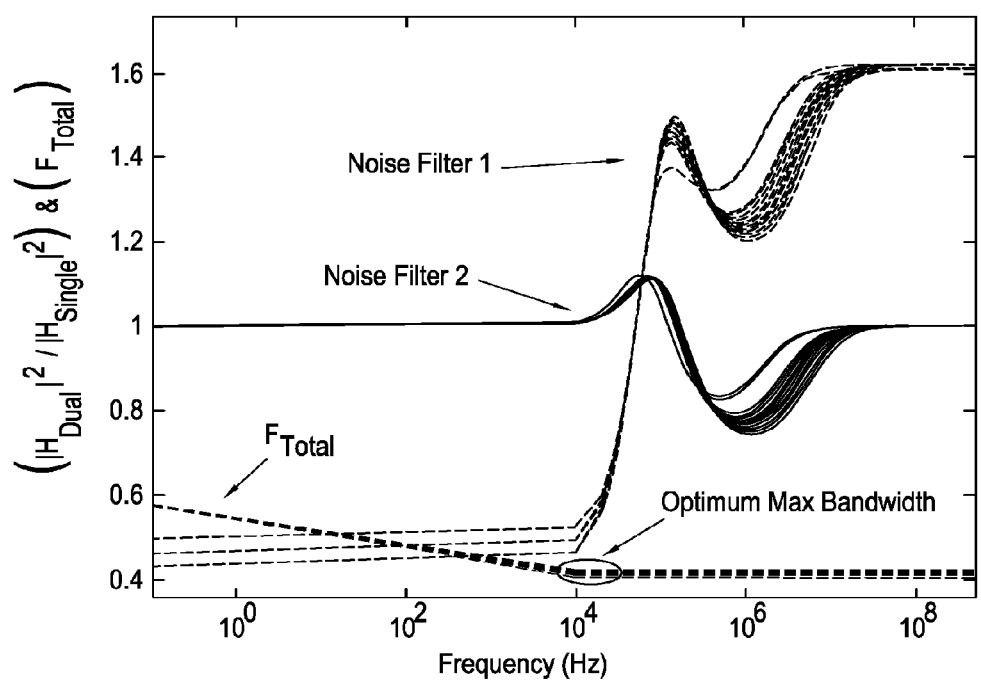
FIG. 7 illustrates a diagram of simulated comparisons of frequency responses and $F_{TOTAL}$ for the output amplifier stage using various transistor sizes.

Previously, we broke apart the noise minimization by considering F with and without the RESET contribution in order to find the optimum feasible lower limit to stage 1 gain. Here, we consider all noise sources into $F_{Total}$. Using Monte Carlo simulated values for the widths of the transistors, the relative frequency dependence on $$|H_{Dual}(j\omega)|^2/|H_{Single}(j\omega)|^2$$

for the noise current filters 1 and 2 is plotted in FIG. 7. We see that for lower frequencies $<10^4$ Hz, the noise gain for noise current 1 for the dual stage is half that of the dual stage due to the negative feedback's frequency compensation. While the dual-stage's negative feedback decreases gain, it trades for higher cut-off frequencies. As expected greater than $10^5$ Hz, the dual stage's noise gain increases due to the greater dominant pole frequencies. The relative gain of noise filter 2 however is unity in lower frequencies and <1 in higher frequencies.

The $F_{Total}$ vs. bandwidth or the maximum frequency set by the external amplifier is plotted to reveal that as the bandwidth is increased, the $F_{Total}$ decreases until ~$10^4$ Hz as a response to noise filter 1's decreased noise gain for the compensated dual stage. After $10^4$ Hz, the bandwidth reaches a near steady-state value of roughly ~0.4. The dual stage's optimum maximum bandwidth relative to the single stage is also shown to be around $10^4$ Hz. The dual-stage outperforms for higher bandwidths.

Figure 8:
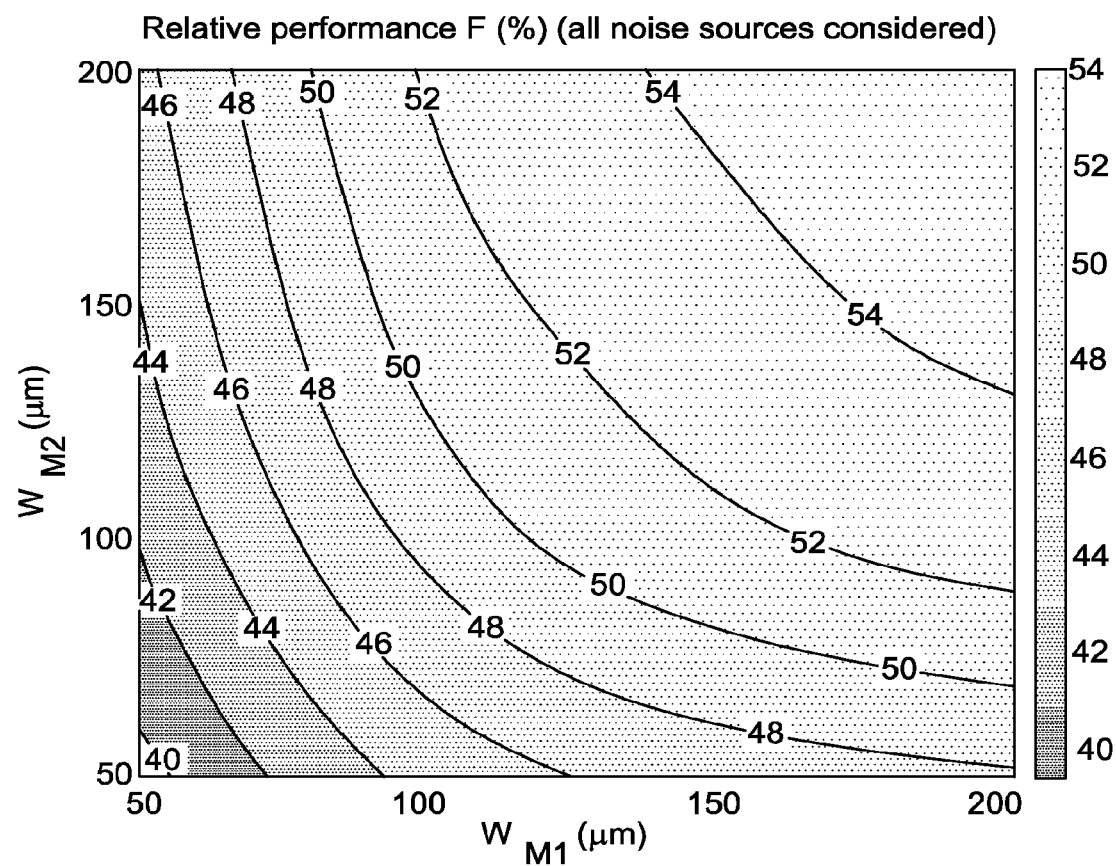
FIG. 8 illustrates a plot of noise performance as a function of transistor width with respect to the transistors of the output amplifier stage in the circuit of FIG. 2.

The relative noise performance is then mapped as a function of the transistor widths of $M_1$ and $M_2$ in FIG. 8 using optimized parameters from Step 1. F is plotted as a contour map for the widths of $M_1$ and $M_2$ in stage 2. We see that F increases with the size increase of $M_1$ due to rise in stage 2 transconductance and total gain. The increase in F for small $W_{M2}$ is due to a substantial increase in thermal noise from an incremental rise in $r_{dsM2}$.

From the equipotential lines that the dual-stage noise performance relative to single-stage's will be minimized when either the width of $M_1$ or width of $M_2$ is decreased. This function can be roughly modeled as a power law:

$$F \propto K(W_{M1} + W_{M2})^\phi$$

where $$\phi > 0, K > 0$$

$$\lim_{(W_{M1}, W_{M2}) \to \infty} F = 1$$

This proportionality is predicted at most operating conditions for all transistors as long as $M_1$, $M_3$, and $M_4$ are saturated while $M_2$ (READ) is in linear mode. Furthermore, as the widths of the $2^{nd}$ stage are made larger to boost gain and decrease flicker noise, F converges to 1 as the $1^{st}$ stage becomes unnecessary.

Figure 9:
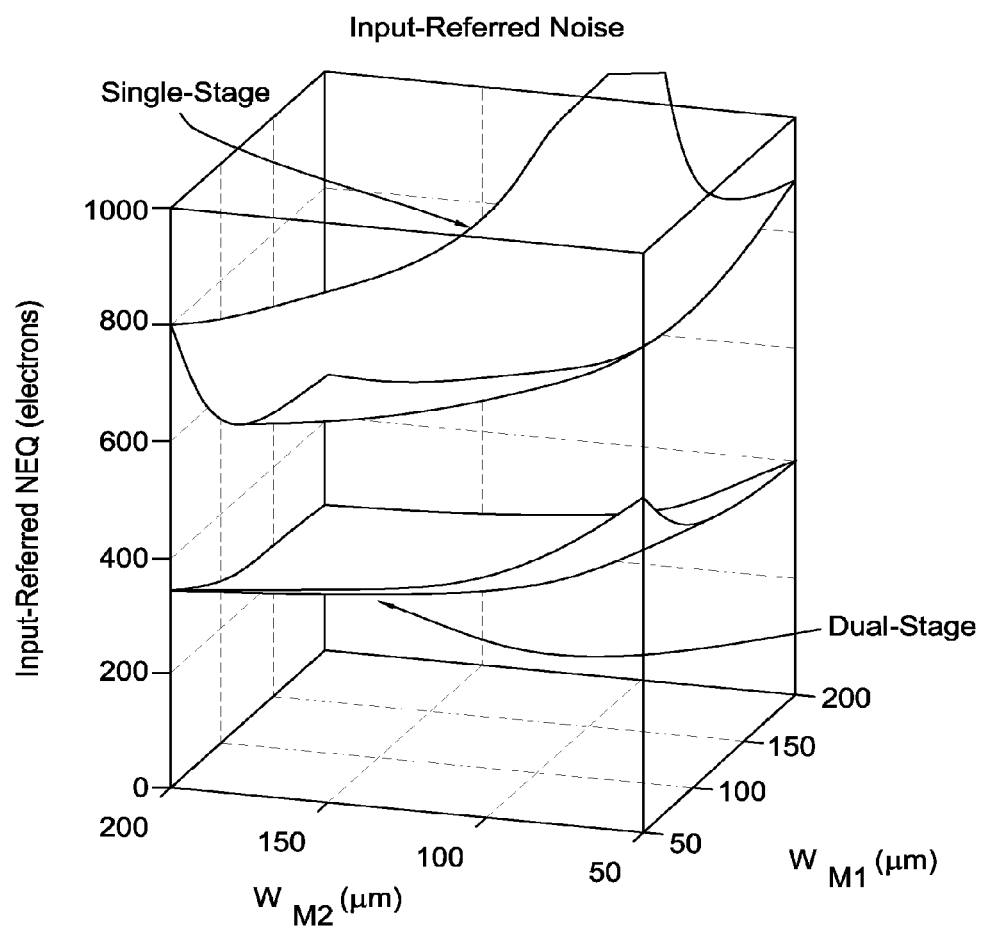
FIG. 9 illustrates a diagram of a model for input-referred noise as a function of transistor width with respect to the transistors of the output amplifier stage for the circuits of both FIG. 1 and FIG. 2.

Using the optimized conditions found from this method, we extract a model for the Input-Referred Noise as functions of the widths of $M_1$ and $M_2$ in FIG. 9.

Experimental Setup and Results

Figure 10:
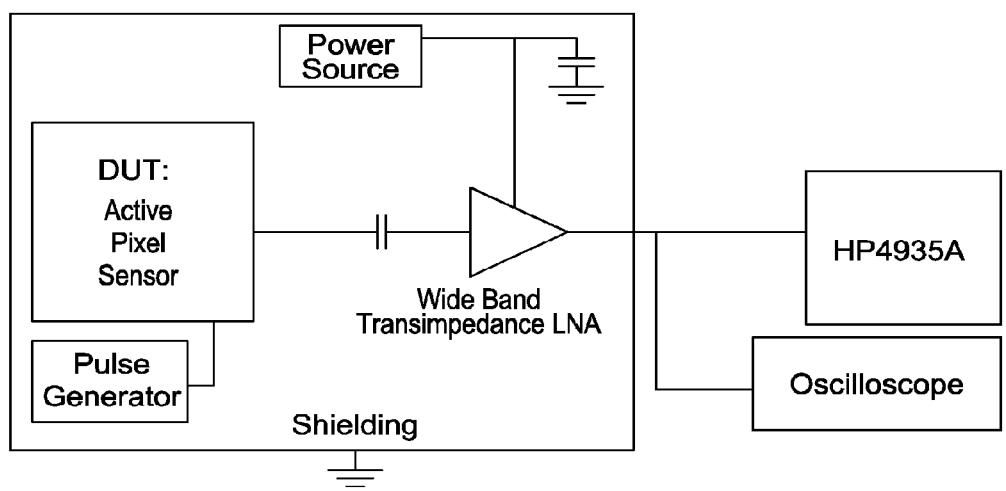
FIG. 10 illustrates a schematic of a noise and gain test measurement setup for the circuits of FIGS. 1 and 2.

Experimental single and dual stage amplifier circuits in accordance with FIGS. 1 and 2, respectively, were fabricated with transistor sizes as summarized in Table I. Stage 1's sizes are fixed for all tests determined by the optimization of gain. RESET is grounded. The experiment compared the output-referred power spectrum density for the single and dual stage APS readout circuits. The experimental noise measurement setup is shown in FIG. 10.

Careful noise measurements were performed by first determining the Power Spectrum Density (PSD) at the output adjusted for the transimpedance (V/A) gain by the low-noise amplifier (LNA). The input-referred noise was then determined by dividing the PSD by the

TABLE I

| Test Circuit | $M_{RESET}$ | $M_1$ (W/L) | $M_2$ (W/L) | $M_3$ (W/L) | $M_4$ (W/L) | $C_{pix}$ (pF) | $C_{store}$ (pF) |
|---|---|---|---|---|---|---|---|
| 1—Single Stage | 30 μm/30 μm | 200 μm/11 μm | 200 μm/11 μm | N/A | | 1.5 ± 1 | N/A |
| 2—Single Stage | | 100 μm/11 μm | 100 μm/11 μm | | | | |
| 3—Single Stage | | 50 μm/11 μm | 50 μm/11 μm | | | | |
| 4—Single Stage | | 100 μm/11 μm | 100 μm/11 μm | | | 4 ± 1 | |
| 5—Dual Stage | | 200 μm/11 μm | 200 μm/11 μm | 200 μm/30 μm | 25 μm/40 μm | 1.5 ± 1 | |
| 6—Dual Stage | | 100 μm/11 μm | 100 μm/11 μm | 200 μm/30 μm | 25 μm/40 μm | | |
| 7—Dual Stage | | 50 μm/11 μm | 50 μm/11 μm | 200 μm/30 μm | 25 μm/40 μm | | |
| 8—Dual Stage | | 100 μm/11 μm | 100 μm/11 μm | 200 μm/30 μm | 30 μm/30 μm | | | signal gain. To measure the signal gain, a pulse generator at the input parallel to the $C_{pix}$ and oscilloscope measures the total voltage gain adjusted for the external LNA gain.

The voltage gain on the first stage of the dual-stage circuit was designed to be near 3.3 V/V. By increasing the size of $M_4$, both the gain and the effective capacitance on the input sensing node increased, lowering the reset variance. $M_4$, however, should not be designed to be too wide, as this will increase the DC bias voltage necessary for the first-stage to work with maximum voltage gain. Furthermore, a further increase in $(W/L)_4$ will increase the flicker noise contribution at the output. Using MATLAB and HSPICE to verify, the transistors for the first stage were fixed at $(W/L)_3=25$ μm/40 μm, $(W/L)_4=200$ μm/30 μm, in order for the voltage gain to be ~3.26 V/V.

Figure 11:
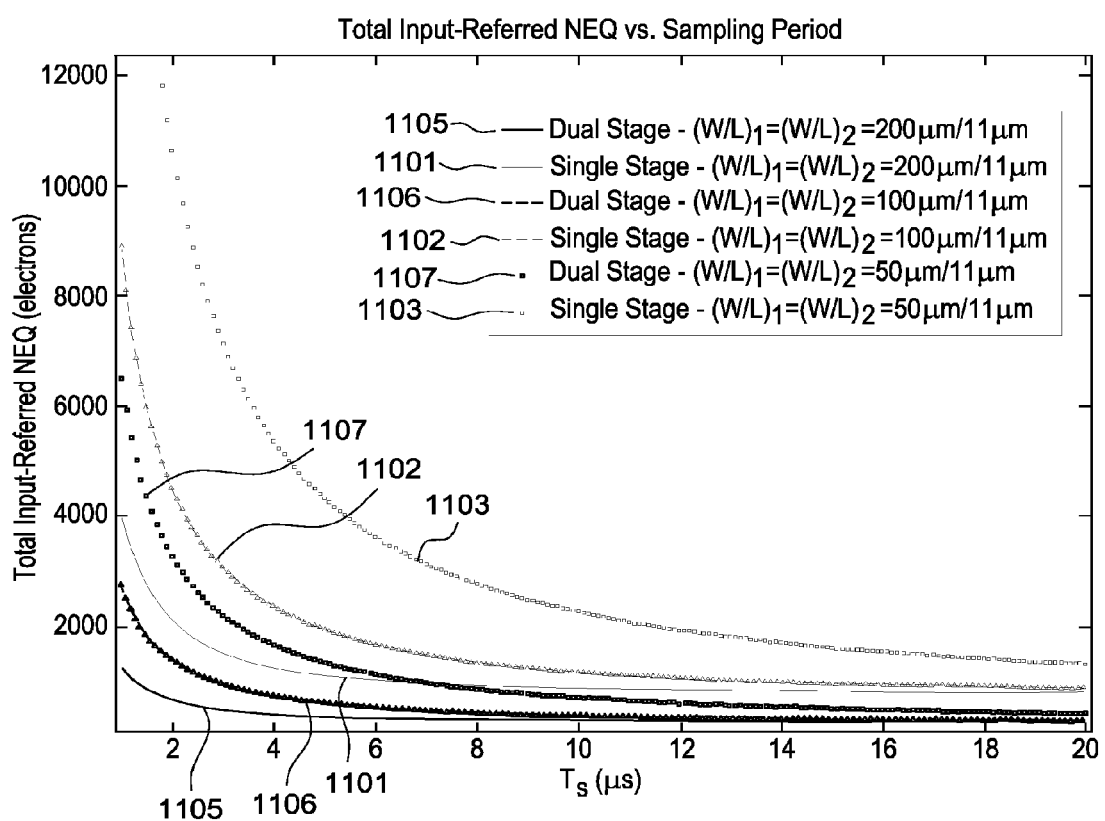
FIG. 11 illustrates plots of input-referred noise vs read sampling periods for different transistor sizes of the circuits of FIGS. 1 and 2.

Some of the unique advantages of using the dual-stage APS readout over the single-stage are potentially faster refresh rates and reduced transistor sizing. In FIG. 11, the total input-referred noise (electrons) is plotted as function of the sampling period. The indicated curves 1101-1103 and 1105-1107 represent the different test circuits used in this study. We see that the dual-stage circuits have substantially better immunity of input reference noise for faster sampling periods than the single-stage design. In addition, for the same input-referred noise the dual-stage design requires shorter widths, which can increase the pixel Fill Factor.

Although the dual stage active pixel devices and related methods herein have been described with reference to specific embodiments, various changes may be made without departing from the spirit or scope of the present disclosure. Examples of such changes have been given in the foregoing description. Accordingly, the disclosure of embodiments herein is intended to be illustrative of the scope of the invention and is not intended to be limiting. It is intended that the scope of this application shall be limited only to the extent required by the appended claims. The dual stage active pixel devices and related methods discussed herein may be implemented in a variety of embodiments, and the foregoing discussion of certain of these embodiments does not necessarily represent a complete description of all possible embodiments. Rather, the detailed description of the drawings, and the drawings themselves, disclose at least one preferred embodiment, and may disclose alternative embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are expressly stated in such claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A device comprising:
a first pixel comprising:
   a photosensor sensitive to a photoimpact;
   an output amplifier stage configured to output a sensor signal of the first pixel; and
   an intermediate amplifier stage coupled between the photosensor and the output amplifier stage;
wherein:
   the intermediate amplifier stage comprises:
      a first intermediate transistor; and
      a second intermediate transistor;
   the first intermediate transistor comprises:
      a channel width of the first intermediate transistor;
      a channel length of the first intermediate transistor;
      a first terminal of the first intermediate transistor, coupled to an intermediate voltage node;
      a second terminal of the first intermediate transistor, coupled to an intermediate node; and
      a control terminal of the first intermediate transistor, coupled to a read signal node;
   and
   the second intermediate transistor comprises:
      a channel width of the second intermediate transistor;
      a channel length of the second intermediate transistor;
      a first terminal of the second intermediate transistor, coupled to the intermediate node;
      a second terminal of the second intermediate transistor, coupled to a ground; and
      a control terminal of the second intermediate transistor, coupled via an input node to the photosensor.

2. The device of claim 1, wherein:
the first pixel comprises an active pixel sensor; and
the intermediate amplifier stage is configured to reduce an input-referred noise of the active pixel sensor.

3. The device of claim 2, wherein:
the input-referred noise is reduced by approximately 40% to approximately 60% by the intermediate amplifier stage.

4. The device of claim 1, wherein:
the output amplifier stage comprises a voltage-to-charge converter; and
the intermediate amplifier stage comprises a voltage-to-voltage amplifier.

5. The device of claim 1, wherein:
the photosensor comprises:
- a first terminal of the photosensor, coupled to the input node; and
- a second terminal of the photosensor, coupled to the ground.

6. The device of claim 5, wherein:
the photosensor comprises a photodiode;
the first terminal of the photosensor comprises a cathode terminal of the photodiode; and
the second terminal of the photosensor comprises an anode terminal of the photodiode.

7. The device of claim 5, wherein:
the photosensor is configured to decrease a voltage of the input node when the photoimpact at the photosensor induces a current through the photosensor.

8. The device of claim 1, wherein:
a gain of the intermediate amplifier stage is at least approximately $\sqrt{2}$; and
the intermediate amplifier stage comprises at least one of:
- the channel width of the second intermediate transistor greater than the channel width of the first intermediate transistor; or
- the channel length of the first intermediate transistor greater than the channel length of the second intermediate transistor.

9. The device of claim 1, wherein:
the first intermediate transistor comprises a first channel width to length ratio;
the second intermediate transistor comprises a second channel width to length ratio; and
the second channel width to length ratio is greater than or equal to two times the first channel width to length ratio.

10. The device of claim 1, wherein:
the channel width of the first intermediate transistor is of approximately 10 µm; and
the channel length of the first intermediate transistor is of between approximately 20 µm to approximately 50 µm;
the channel width of the second intermediate transistor is of between approximately 100 µm to approximately 200 µm; and
the channel length of the second intermediate transistor is of approximately 10 µm.

11. The device of claim 1, wherein:
the first pixel further comprises:
- a reset transistor comprising:
  - a first terminal of the reset transistor, coupled to a reset voltage node;
  - a second terminal of the reset transistor, coupled to the input node; and
  - a control terminal of the reset transistor, coupled to a reset signal node.

12. The device of claim 1, wherein:
the output amplifier stage comprises:
- a first output transistor; and
- a second output transistor;
the first output transistor comprises:
- a first terminal of the first output transistor, coupled to an output voltage node;
- a second terminal of the first output transistor, coupled to the second output transistor; and
- a control terminal of the first output transistor, coupled to the intermediate node;
and
the second output transistor comprises:
- a first terminal of the second output transistor, coupled to the second terminal of the first output transistor;
- a second terminal of the second output transistor, coupled to an output of the first pixel; and
- a control terminal of the second output transistor, coupled to the read signal node.

13. The device of claim 12, wherein:
the second terminal of the second output transistor is coupled to an external amplifier comprising at least one of:
- a current-to-charge amplifier; or
- an integrating amplifier;
a capacitance of the external amplifier is incrementable via the output amplifier stage; and
the capacitance of the external amplifier is incremented more when the photoimpact at the photosensor causes a gate voltage of the second intermediate transistor to decrease than when the photoimpact is absent.

14. The device of claim 12, wherein:
the first and second intermediate transistors, and the first and second output transistors, comprise NMOS transistors.

15. The device of claim 12, wherein:
the first and second intermediate transistors, and the first and second output transistors, comprise at least one of amorphous silicon transistors or pentacene transistors.

16. A method comprising:
providing a first active pixel of an array of one or more active pixels;
wherein providing the first active pixel comprises:
- providing a photosensor sensitive to a photoimpact;
- providing an intermediate amplifier stage coupled to the photosensor and configured to restrict an input reference noise of the first active pixel; and
- providing an output amplifier stage coupled to the intermediate amplifier stage and configured to:
  - output a first current magnitude when the photosensor is exposed to the photoimpact; and
  - output a second current magnitude when the photosensor is unexposed to the photoimpact.

17. The method of claim 16, wherein:
providing the intermediate amplifier stage comprises:
providing a first intermediate transistor comprising:
- a first terminal of the first intermediate transistor, coupled to an intermediate voltage node;
- a second terminal of the first intermediate transistor, coupled to an intermediate node; and
- a control terminal of the first intermediate transistor, coupled to a read signal node;
and
providing a second intermediate transistor comprising:
- a first terminal of the second intermediate transistor, coupled to the intermediate node;
- a second terminal of the second intermediate transistor, coupled to a ground; and
- a control terminal of the second intermediate transistor, coupled via an input node to the photosensor.

18. The method of claim 17, wherein:
providing the photosensor comprises:
- coupling a cathode terminal of the photosensor to the input node; and
- coupling an anode terminal of the photosensor to the ground.

19. The method of claim 17, wherein:
providing the first active pixel further comprises:
providing a reset transistor comprising:
- a first terminal of the reset transistor, coupled to a reset voltage node;

a second terminal of the reset transistor, coupled to the input node; and
a control terminal of the reset transistor, coupled to a reset signal node.

20. The method of claim 17, wherein:
providing the intermediate amplifier stage comprises at least one of:
providing a channel width of the second intermediate transistor greater than a channel width of the first intermediate transistor; or
providing a channel length of the first intermediate transistor greater than a channel length of the second intermediate transistor.

21. The method of claim 17, wherein:
providing the output amplifier stage comprises:
providing a first output transistor comprising:
a first terminal of the first output transistor, coupled to an output voltage node;
a second terminal of the first output transistor, coupled to a second output transistor; and
a control terminal of the first output transistor, coupled to the intermediate node;
and
providing the second output transistor comprising:
a first terminal of the second output transistor, coupled to the second terminal of the first output transistor;
a second terminal of the second output transistor, coupled to an external amplifier; and
a control terminal of the second output transistor, coupled to the read signal node.

22. The method of claim 21, wherein:
providing the first active pixel comprises:
configuring the first active pixel such that, when the photoimpact misses the photosensor:
a gate-to-source voltage of the second intermediate transistor remains substantially unaffected such that, when a read signal actuates the second output transistor and the first intermediate transistor, a gate voltage of the first output transistor is set to a first gate voltage level via the first intermediate transistor to actuate the first output transistor and charge a capacitance of the external amplifier to a first charge level via the first and second output transistors;
and
configuring the first active pixel such that, when the photoimpact is incident on the photosensor:
the gate-to-source voltage of the second intermediate transistor is decreased such that, when the read signal actuates the second output transistor and the first intermediate transistor, the gate voltage of the first output transistor is set to a second gate voltage level via the first intermediate transistor to actuate the first output transistor and charge the capacitance of the external amplifier to a second charge level via the first and second output transistors.

23. The method of claim 22, wherein:
the second gate voltage level is greater than the first gate voltage level;
the second charge level is greater than the first charge level;
a gain of the intermediate amplifier stage is at least approximately $\sqrt{2}$; and
the external amplifier comprises at least one of:
a current-to-charge amplifier; or
an integrating amplifier.

24. A device comprising:
a plurality of active pixels coupled to an external amplifier to detect and register a photoimpact;
wherein:
the plurality of active pixels comprises a first pixel;
the first pixel comprises:
a photosensor configured to detect the photoimpact when the photoimpact is incident on the photosensor;
an output amplifier stage configured to output a sensor signal indicative of the photoimpact at the first pixel;
an intermediate amplifier stage coupled between the photosensor and the output amplifier stage; and
a reset transistor coupled to the photosensor;
the output amplifier stage comprises first and second transistors;
the intermediate amplifier stage comprises third and fourth transistors;
the first transistor comprises:
a first terminal of the first transistor, coupled to a first voltage node;
a second terminal of the first transistor, coupled to the second transistor; and
a control terminal of the first transistor, coupled to the intermediate amplifier stage;
the second transistor comprises:
a first terminal of the second transistor, coupled to the second terminal of the first transistor;
a second terminal of the second transistor, coupled to the external amplifier; and
a control terminal of the second transistor, coupled to a read signal node to receive a read signal;
the third transistor comprises:
a first terminal of the third transistor, coupled to a second voltage node;
a second terminal of the third transistor, coupled to the control terminal of the first transistor; and
a control terminal of the third transistor, coupled to the read signal node to receive the read signal;
the fourth transistor comprises:
a first terminal of the fourth transistor, coupled to the second terminal of the third transistor and to the control terminal of the first transistor;
a second terminal of the fourth transistor, coupled to a ground; and
a control terminal of the fourth transistor, coupled to the photosensor and to the reset transistor;
the reset transistor comprises:
a first terminal of the reset transistor, coupled to a third voltage node;
a second terminal of the reset transistor, coupled to the photosensor and to the fourth transistor; and
a control terminal of the reset transistor, coupled to a reset signal node;
and
the photosensor comprises:
a cathode terminal coupled to the control terminal of the fourth transistor and to the second terminal of the reset transistor; and
an anode terminal coupled to the ground.

25. The device of claim 24, wherein:
when the photoimpact is absent:
a gate voltage of the fourth transistor remains substantially unaffected such that, when the read signal actuates the second and third transistors, a gate voltage of the first transistor is set to a first gate voltage level via the third transistor to actuate the first transistor and charge a capacitance of the external amplifier to a first charge level via the first and second transistors;

when the photoimpact is incident on the photosensor:

the gate voltage of the fourth transistor is decreased such that, when the read signal actuates the second and third transistors, the gate voltage of the first transistor is set to a second gate voltage level via the third transistor to actuate the first transistor and charge the capacitance of the external amplifier to a second charge level via the first and second transistors;

the second gate voltage level is greater than the first gate voltage level; and the second charge level is greater than the first charge level.

* * * * *